United States Patent

Duncan

[15] 3,664,896

[45] May 23, 1972

[54] DEPOSITED SILICON DIFFUSION SOURCES

[72] Inventor: David M. Duncan, 403 Roosevelt Way, San Francisco, Calif. 94114

[22] Filed: July 28, 1969

[21] Appl. No.: 845,373

[52] U.S. Cl. ..........................................148/187, 317/235 R
[51] Int. Cl. ..........................................................H01l 7/44
[58] Field of Search..................................148/187; 317/235

[56] References Cited

UNITED STATES PATENTS 3,460,007 8/1969 Scott, Jr................................317/235
3,484,313 12/1969 Tauchi et al..........................148/187

*Primary Examiner*—L. Dewayne Rutledge
*Assistant Examiner*—J. Davis
*Attorney*—Roger S. Borovoy and Alan H. MacPherson

[57] ABSTRACT

Non-single crystal semiconductor material formed on a semiconductor substrate and separated from all but a portion of the substrate by an intervening insulation layer contains at least one dopant and preferably two dopants of opposite conductivity type. Heating the substrate, together with the overlying insulation and non-single crystal semiconductor layers, drives the dopants contained in the non-single crystal semiconductor material into the underlying semiconductor substrate in such a manner as to form diodes or transistors.

3 Claims, 8 Drawing Figures

INVENTOR.
DAVID M. DUNCAN
BY Alan H. MacPherson
ATTORNEY

DEPOSITED SILICON DIFFUSION SOURCES

FIELD OF THE INVENTION

This invention relates to the fabrication of semiconductor devices and in particular to the use of a layer of deposited amorphous or polycrystalline silicon containing controlled amounts of dopants as the diffusion source.

PRIOR ART

Diffused silicon devices are well known. Typically, to produce such a device, a region of a silicon substrate is masked with a selectively shaped pattern of masking material, such as silicon dioxide. Then a diffusion source, either a gas or a solid containing the diffusant, is passed next to or placed adjacent to the region of silicon into which a dopant is to be diffused. Heating of the substrate and the source drives the dopant into the substrate. The diffusion distance and concentration depends upon the time and temperature at which the diffusion is carried out, the concentration of diffusant in the source, and the diffusion coefficient of the diffusant.

In producing double-diffused devices, such as NPN or PNP transistors, the commonly used technique requires two diffusion steps. First, the base is diffused into the silicon substrate. Then, the emitter is diffused into the base. Unfortunately, the emitter diffusion always results in further diffusion of the base into the collector and thus makes it difficult to obtain the desired width of the base region.

SUMMARY OF THE INVENTION

This invention, on the other hand, overcomes the problems of the prior art diffusing techniques and provides a diffusion process which is capable of producing extremely shallow base and emitter junctions. The technique of this invention requires no contact cuts. Nor does this technique require "washing the emitter", i.e. etching away the phosphorus glass formed on the emitter surface during emitter diffusion prior to forming the emitter contact, with the consequent danger of exposing the emitter-base junction. Thus this technique yields improved results over prior techniques. The resulting junctions are protected by the process from damage by metal contacts or during probing.

According to this invention, a layer of non-single crystal semiconductor material, typically either amorphous or polycrystalline silicon, containing a controlled amount of dopant, is used as the diffusion source. The non-single crystal semiconductor material, deposited on a semiconductor substrate by any standard technique, such as electron beam evaporation, sputtering or chemical deposition, contains either a single dopant or a combination of different dopant species with different diffusion coefficients vis-a-vis the semiconductor substrate. The substrate with the overlying non-single crystal semiconductor material is then heated, driving the dopant or dopants into the underlying semiconductor substrate.

By placing two different-type dopant species with different diffusion coefficients in the non-single crystal semiconductor material, and then heating, complete active devices, such as NPN transistors, are fabricated with a single diffusion step.

After diffusion, selected portions of the non-single crystal semiconductor material are removed but the non-single crystal semiconductor material over the diffused emitter is left on to serve as a conductive contact between the shallow emitter region and an overlying metal contact layer. This material prevents the emitter contact metal from alloying through the emitter-base junction and thus destroying the device.

Although either amorphous or polycrystalline semiconductor material can be used as the dopant source, the diffusion heating will convert the amorphous semiconductor material into polycrystalline semiconductor material.

An additional embodiment of this invention uses a portion of a silicon oxide layer placed between polycrystalline silicon and an underlying silicon substrate as a P-type dopant source in addition to the polycrystalline silicon. Upon heating, the P-type dopant — typically boron — in both the oxide and the polycrystalline silicon diffuses into the underlying substrate to form a base region, while an N-type dopant in the polycrystalline silicon diffuses more slowly into the substrate through a window in the oxide to form an emitter region.

DETAILED DESCRIPTION

While the process of this invention will be described in terms of silicon technology, the principles of this invention can be used with other semiconductor materials, such as germanium.

Figure 1A:
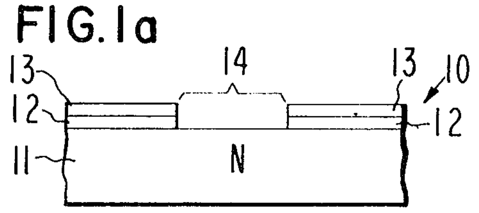
FIGS. 1*a* through 1*d* illustrate the process of this invention for the case where the polycrystalline silicon contains one dopant.

FIG. 1a shows a semiconductor substrate 11, typically monocrystalline silicon, together with an overlying layer 12 of silicon dioxide aNd an overlying layer 13 of silicon nitride. Oxide and nitride layers 12 and 13 are formed by processes well known in the semiconductor arts. A window 14 is cut through layers 12 and 13 exposing a portion of the top surface of substrate 11. Hereafter, substrate 11, together with any overlying layers such as layers 12 and 13, will be referred to as wafer 10.

Figure 1B:
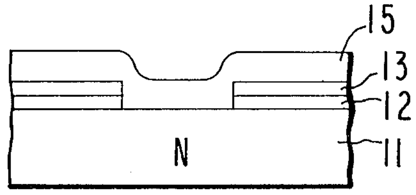

Next, as shown in FIG. 1*b*, a layer 15 of amorphous or polycrystalline silicon, typically on the order of 1 micron thick, is placed over the top surface of wafer 10. Layer 15 contacts and adheres to the top surface of nitride layer 13 and, in the region of window 14, the top surface of substrate 11. Layer 15 is formed by conventional techniques, such as electron beam evaporation, sputtering, or chemical deposition. Descriptions and techniques for forming amorphous or polycrystalline silicon are well known and thus will not be described in further detail.

In accordance with this invention, silicon layer 15 contains at least one selected dopant. This dopant is placed in the amorphous or polycrystalline silicon 15 by one of several possible methods. One method directly vapor deposits silicon layer 15 from silane mixed with hydrides or other species of dopant such as phosphine, arsine or diborane. The result when this is done under the right conditions, is a properly doped amorphous or polycrystalline silicon film 15. Alternatively, layer 15 can be obtained from evaporation of dual sources, using well-known electron beam evaporation techniques. A third method sputters layer 15 onto wafer 10 from a silicon source containing a correct concentration of impurity. These three techniques are standard in the semiconductor arts and will not be described in detail. The impurity concentration in amorphous or polycrystalline silicon layer 15 can be any concentration desired, although typically it will be somewhere between $10^{18}$ to $10^{21}$ impurity atoms/cm$^3$.

Wafer 10 is next heated to a temperature somewhere in the range of 1,000° C. This heating both converts any amorphous silicon in layer 15 to polycrystalline silicon and drives the diffusant contained in layer 15 into underlying substrate 11 to form region 16. If the diffusant contained in layer 15 is a P-type acceptor impurity, such as boron, then region 16 is a P-type region. When substrate 11 is of N-type material, the diffused region 16 thus forms a PN junction 17 with substrate 11. Wafer 10 thus contains a diode as a result of the heating. Nitride layer 13, impervious to most impurities contained in polycrystalline layer 15, prevents the impurities contained in polycrystalline silicon layer 15 from diffusing into those portions of substrate 11 beneath layer 13.

The impurity distribution and concentration in region 16 varies, of course, with distance according to the well-known diffusion equations. By controlling the time and temperature of the heating, as well as the diffusant concentration in polycrystalline silicon layer 15, the thickness of, and concentration of impurity in, region 16 is controlled. Region 16 can be as little as 100 angstroms thick. Typical graphs illustrating the relationships of the variables which control diffusion depth and concentration are found in Chapter 3 of the book "Physics and Technology of Semiconductor Devices" by A.S. Grove, published in 1967 by John Wiley & Sons, Inc.

Figure 1C:
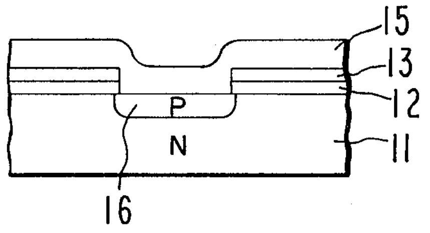
Figure 1D:
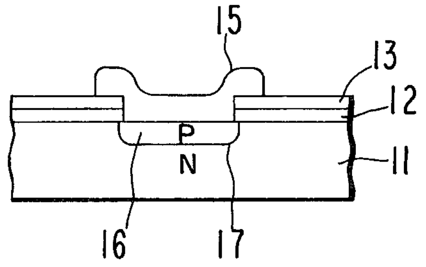

Next, as shown in FIG. 1d, portions of polycrystalline silicon layer 15 are removed from wafer 10 leaving polycrystalline silicon overlying region 16 and a small adjacent portion of nitride layer 13. This remaining polycrystalline silicon has a conductivity determined by the impurity concentration within the polycrystalline silicon. However, the impurity concentration is sufficiently high (typically around $10^{18}$ impurity atoms per cc or higher) to make polycrystalline silicon 15 essentially behave as a conductor. The portion of polycrystalline silicon layer 15 left over region 16 (FIG. 1d) serves as a conductive contact between the shallow underlying diffused region 16 and an overlying metal contact layer (not shown in the drawing). This polycrystalline silicon thus prevents the contact metal from alloying through region 16 during the formation of the metal contact.

Nitride layer 13 shown in FIGS. 1*a* through 1*d* is not essential in producing a diode such as shown in FIG. 1*d*, unless a dopant species is used in polycrystalline silicon layer 15 which would not be masked by oxide layer 12. This however, is a highly unusual situation as most dopants, with the exception of gallium, are masked by silicon dioxide. However, silicon nitride layer 13 does prevent sodium ions from traveling through the insulation on top of the device to contaminate the interface between substrate 11 and silicon dioxide layer 12. Because both silicon and silicon nitride are impervious to sodium ions, the structure shown in FIG. 1*d*, with a polycrystalline silicon layer overlying the exposed surface of substrate 11, is essentially passivated.

While so far this invention has been described in conjunction with the formation of a single diffused region in a monocrystalline substrate of silicon, the principles of this invention can be extended to the simultaneous formation of diffused base and emitter regions in an underlying substrate, thereby to produce a high-frequency equivalent of the double-diffused planar transistor. FIGS. 2*a* through 2*d* illustrate this process.

Figure 2A:
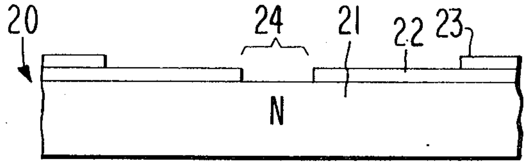
FIGS. 2*a* through 2*d* illustrate the processes of this invention for the cases where the polycrystalline silicon contains two dopants of opposite conductivity types, and where both the polycrystalline silicon and a portion of the underlying silicon oxide are used as dopant sources.
Figure 2B:
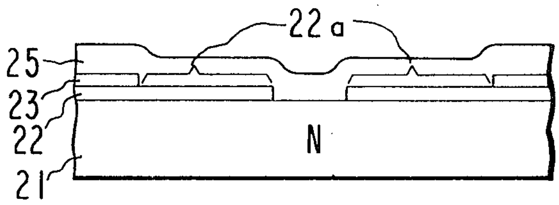
Figure 2C:
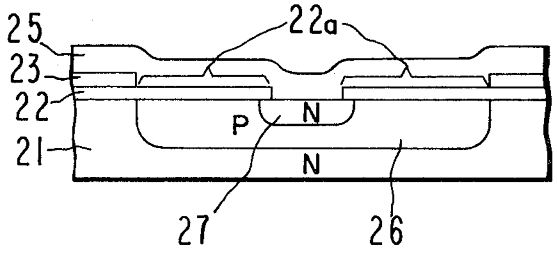

In FIG. 2*a*, a wafer 20, consisting of monocrystalline silicon substrate 21, doped with N-type impurities to a concentration somewhere between $10^{14}$ and $10^{17}$ impurity atoms/cm$^3$, together with overlying silicon oxide layer 22 and silicon nitride layer 23, contains a window 24 exposing a portion of a top surface of substrate 21. Nitride layer 23 is set back, as shown, relative to oxide layer 22,from window 24. Next, as shown in FIG. 2*b*, a layer 25 of amorphous or polycrystalline silicon is formed over the top surface of wafer 20, contacting the exposed surfaces of substrate 21, oxide layer 22 and nitride layer 23. Layer 25,typically on the order of 1 micron thick, contains two dopants of opposite conductivity type. Usually, these dopants are gallium, an acceptor impurity, and arsenic, a donor impurity. The gallium concentration in layer 25 is typically $10^{18}$ impurity atoms/cm$^3$ while the arsenic concentration in layer 25 is typically several times $10^{20}$ impurity atoms/cm$^3$. At 1,000° C, the diffusivity of gallium in silicon is about three times the diffusivity of arsenic in silicon. Furthermore, gallium will diffuse through silicon dioxide, while arsenic will not. In general, because N-type dopants characteristically diffuse more slowly into silicon than do P-type dopants, this diffusion rate differential means that with silicon, the technique of this invention is feasible only for the production of NPN transistors. If the same technology is applied to germanium, only PNP devices are produced because the diffusion rate differential is just the opposite in germanium.

Wafer 20 is next heated to an appropriate temperature, typically 1,000° C for a selected period of time. Gallium impurities contained within polycrystalline silicon layer 25 diffuse into the underlying substrate both directly through window 24 and indirectly through oxide layer 22. As a result a base region 26 is formed in substrate 21. Simultaneously, arsenic impurities diffuse solely through window 24 into underlying substrate 21 to form emitter region 27. By holding wafer 20 at 1,000° C for about five minutes, an emitter region 27 just a few hundred angstroms thick is produced in base region 26. Base region 26 is approximately 600 angstroms thick.

Figure 2D:
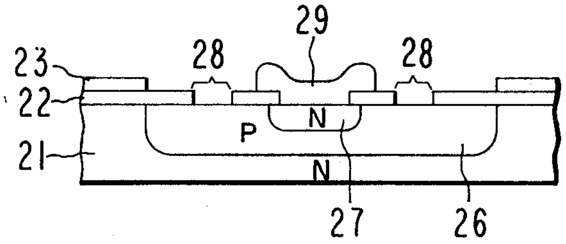

Next, as shown in FIG. 2*d*, a good portion of polycrystalline silicon layer 25 is removed leaving only polycrystalline silicon 29 overlying both emitter region 27 and certain adjacent portions of silicon dioxide 22. Contact windows 28 are also cut in oxide layer 22. Metal layers (not shown) are next deposited over windows 28 to contact P-type base region 26. In addition, metal layers deposited on polycrystalline silicon 29 provide electrical contact through polycrystalline silicon 29 to shallow emitter region 27. Polycrystalline silicon 29, as in the prior description associated with FIGS. 1*a* through 1*d*, prevents contact metals, such as aluminum, from alloying through shallow emitter region 27 into the underlying base region 27 and thereby destroying the device.

In a third embodiment of this invention, boron is placed in that portion of silicon oxide layer 22 (FIGS. 2*b*, 2*c*) labeled 22*a*. Boron impurities can be formed in such oxide by stripping the oxide 22 originally deposited on substrate 21 and not covered by nitride layer 23 from the top surface of substrate 21, and then regrowing the oxide with a selected dopant concentration using for example, one of the processes described by M.L. Barry and P. Olofsen in an article entitled "Advances in Doped Oxides as Diffusion Sources" published in Volume 2, number 10 of Solid State Technology, pages 39–42, October 1968. Oxide layers 22*a* will contain a P-type impurity, such as boron, with a concentration on the order of $10^{19}$ atoms/cm$^3$ or greater.

Although silicon dioxide layer 22 including regions 22*a*, is substantially impervious to the travel of boron from silicon layer 25 to underlying substrate 21, the impurity contained within silicon dioxide regions 22*a* does, upon the heating of wafer 20, travel from the oxide layer 22*a* into the underlying silicon substrate 21. Furthermore, the boron contained within silicon layer 25 travels through window 24 into the underlying silicon substrate 21. Therefore a base region is formed in silicon substrate 21 extending to the edges of nitride layer 23. Arsenic impurities from polycrystalline silicon 25 simultaneouslydiffuse through window 24 into a smaller region of underlying substrate 21. Because boron diffuses at a faster rate in silicon than does arsenic, the emitter region 27 is formed within base region 26.

When silicon oxide regions 22*a* contain a boron impurity to a concentration of about $10^{19}$ atoms/cm$^3$ and when polycrystalline silicon layer 25 contains an arsenic impurity with a concentration on the order of several times $10^{20}$ atoms/cm$^3$, five minutes of heating at 1,000° C drives the arsenic impurity 200 angstroms into underlying substrate 21, while the boron impurity from the polycrystalline silicon 25 and the silicon oxide regions 22*a* is driven 800 angstroms into the underlying substrate 21. The base width, i.e. the distance from the bottom of the emitter junction to the bottom of the base junction, is approximately 600 angstroms.

As a result of this invention, extremely shallow junctions can be fabricated both because the base region is not further diffused into the collector during the formation of the emitter region, and because the polycrystalline silicon used to contain the diffusants remains over the shallow emitter region preventing destruction of the emitter-base junction through alloying of the contact metal to the device. Extremely shallow devices built using this technique result in transistors suitable for high-frequency operation, having very thin base and collector regions and thus low capacitances.

What is claimed is:

1. The method of forming simultaneously two diffused regions of opposite conductivity type in a semiconductor substrate containing a first selected concentration of an impurity of a first conductivity type, the surface of said substrate being covered by an insulating layer of an oxide of the material of said semiconductor substrate with a first window through said oxide exposing a first portion of the surface of said semiconductor substrate, said oxide being partially covered by a layer of silicon nitride with a second window formed in said nitride layer on top of but larger than said first window in said oxide layer to expose not only said first portion of the surface of said semiconductor substrate but also a portion of the surface of said oxide, the oxide exposed by said second window containing a second selected concentration of an impurity of a second conductivity type, which comprises:

forming a layer of non-single crystal semiconductor material on said nitride and oxide layers and over the exposed portion of the surface of said underlying semiconductor substrate, said non-single crystal semiconductor material containing a third selected concentration of an impurity of said second conductivity type and a fourth selected concentration of an impurity of said first conductivity type, said fourth selected concentration being greater than said third selected concentration, which in turn is greater than said first selected concentration, and heating said substrate with said oxide and nitride layers and said overlying non-single crystal semiconductor material to a selected temperature for a selected time, thereby to drive the impurity from said oxide into that portion of said semiconductor substrate beneath the oxide exposed by said second window while the impurities of said first and second conductivity types in said non-single crystal semiconductor material diffuse through said first window into said semiconductor substrate.

2. The process of claim 1 wherein said first selected concentration is in the range of approximately $10^{14}$ to $10^{17}$ impurity atoms/$cm^3$, said third selected concentration is on the order of $10^{19}$ atoms/$cm^3$ and said fourth selected concentration is on the order of at least $10^{20}$ atoms/$cm^3$.

3. The process of claim 2 in which said impurity of said second conductivity type is boron, and said second selected concentration is on the order of $10^{19}$ impurity atoms per cubic centimeter.

* * * * *